(12) United States Patent
Rhodes

(10) Patent No.: US 8,461,692 B2
(45) Date of Patent: Jun. 11, 2013

(54) SEMICONDUCTOR DEVICE STRUCTURES INCLUDING DAMASCENE TRENCHES WITH CONDUCTIVE STRUCTURES AND RELATED METHOD

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/237,447

(22) Filed: Sep. 20, 2011

(65) Prior Publication Data

US 2012/0007209 A1 Jan. 12, 2012

Related U.S. Application Data

(60) Continuation of application No. 11/291,176, filed on Nov. 30, 2005, now Pat. No. 8,053,899, which is a division of application No. 10/378,796, filed on Mar. 4, 2003, now Pat. No. 7,074,717.

(51) Int. Cl.
*H01L 23/48* (2006.01)
*H01L 21/4763* (2006.01)

(52) U.S. Cl.
USPC ............ 257/774; 257/E21.585; 438/637; 438/639; 438/675; 438/700

(58) Field of Classification Search
USPC ............ 257/296, 300, 301, 303, 304, 306, 257/774, E21.584, E21.585; 438/629, 637, 438/639, 672, 675, 700
See application file for complete search history.

(56) References Cited

U.S. PATENT DOCUMENTS

| | | | |
|---|---|---|---|
| 5,126,006 A | 6/1992 | Cronin et al. | |
| 5,250,457 A | 10/1993 | Dennison | |
| 5,338,700 A | 8/1994 | Dennison et al. | |
| 5,595,937 A | 1/1997 | Mikagi | |
| 5,598,027 A | 1/1997 | Matsuura | |
| 5,612,254 A | 3/1997 | Mu et al. | |
| 5,635,432 A | 6/1997 | Honda et al. | |
| 5,728,595 A | 3/1998 | Fukase | |
| 5,795,823 A | 8/1998 | Avanzino et al. | |
| 5,858,877 A | 1/1999 | Dennison et al. | |
| 5,990,011 A | 11/1999 | McTeer | |
| 5,990,524 A * | 11/1999 | En et al. ................. 257/382 |
| 6,060,386 A | 5/2000 | Givens | |

(Continued)

OTHER PUBLICATIONS

Kaanta, Damascene: A ULSI Wiring Technology, VMIC Conference, Jun. 11-12, 1991, pp. 144-152.

(Continued)

*Primary Examiner* — Hung Vu
(74) *Attorney, Agent, or Firm* — TraskBritt

(57) ABSTRACT

A method and apparatus for providing a conductive structure adjacent to a damascene conductive structure in a semiconductor device structure. The semiconductor device structure includes an insulation layer with at least one damascene conductive structure formed therein, wherein the at least one damascene conductive structure includes an insulative, protective layer disposed thereon. The insulative material of the protective layer is able to resist removal by at least some suitable etchants for the insulative material of the insulation layer adjacent to the at least one damascene conductive structure. A self-aligned opening is formed by removing a portion of an insulation layer adjacent the at least one damascene conductive structure. The self-aligned opening is then filled with a conductive material to thereby provide another conductive structure adjacent to the at least one damascene conductive structure.

19 Claims, 11 Drawing Sheets

U.S. PATENT DOCUMENTS

| | | |
|---|---|---|
| 6,077,733 A | 6/2000 | Chen et al. |
| 6,080,655 A | 6/2000 | Givens et al. |
| 6,117,791 A | 9/2000 | Ko et al. |
| 6,133,144 A | 10/2000 | Tsai et al. |
| 6,245,669 B1 | 6/2001 | Fu et al. |
| 6,248,643 B1 | 6/2001 | Hsieh et al. |
| 6,265,779 B1 | 7/2001 | Grill et al. |
| 6,316,348 B1 | 11/2001 | Fu et al. |
| 6,323,118 B1 | 11/2001 | Shih et al. |
| 6,348,411 B1 | 2/2002 | Ireland et al. |
| 6,359,301 B1 * | 3/2002 | Kuroda .................. 257/306 |
| 6,380,082 B2 | 4/2002 | Huang et al. |
| 6,433,381 B2 * | 8/2002 | Mizutani et al. ............ 257/311 |
| 6,579,785 B2 | 6/2003 | Toyoda et al. |
| 7,183,222 B2 * | 2/2007 | Qiao ........................... 438/723 |
| 2001/0052614 A1 | 12/2001 | Ishibashi |
| 2001/0055842 A1 * | 12/2001 | Uh et al. ...................... 438/183 |

OTHER PUBLICATIONS

Licata, Dual Damascene AL Wiring for 256M DRAM, VMIC Conference, Jun. 27-29, 1995, pp. 596-602.

* cited by examiner

SEMICONDUCTOR DEVICE STRUCTURES INCLUDING DAMASCENE TRENCHES WITH CONDUCTIVE STRUCTURES AND RELATED METHOD

CROSS-REFERENCE TO RELATED APPLICATIONS

This application is a continuation of U.S. patent application Ser. No. 11/291,176, filed Nov. 30, 2005, now U.S. Pat. No. 8,053,899, issued Nov. 8, 2011, which application is a divisional of U.S. patent application Ser. No. 10/378,796, filed Mar. 4, 2003, now U.S. Pat. No. 7,074,717, issued Jul. 11, 2006, the disclosure of each of which document is incorporated herein by reference in its entirety.

TECHNICAL FIELD

The present invention relates generally to integrated circuit manufacturing technology. More specifically, the present invention relates to a method and structure that provide a self-aligning contact opening adjacent one or more conductive structures that are formed using a damascene process.

BACKGROUND

Interconnection techniques are used in semiconductor processing to electrically interconnect devices over a semiconductor wafer. Historically in the semiconductor industry, subtractive metal etches or lift-off techniques have been employed as the main metal-patterning techniques. Metal etching usually involves the deposition of a conductive layer of material over the surface of the semiconductor substrate. The conductive material is then patterned and etched, whereby the conductive material is removed (i.e., subtracted) from the desired locations, leaving behind conductive interconnect lines. However, problems associated with this interconnect processing method include: increased process complexity; increased process steps due to preventing and/or removing corrosion of the conductive lines; lack of cost efficiency; resist burn and resist time criticality; etc. As such, increasing the density, performance, and fabrication parameters associated with semiconductor metallization have led to new approaches toward interconnect fabrication.

Damascene and dual damascene processes are examples of currently employed semiconductor processing methods that are used to form conductive lines and conductive contacts. The damascene technique is an interconnection fabrication process in which trenches or other recesses are formed in an insulation or dielectric layer of a semiconductor device. These trenches are then filled with a metal or other conductive material to form conductive structures. The dual damascene process is a multilevel interconnection fabrication process in which contact openings are also formed in an insulation or dielectric layer of a semiconductor device. The trenches and the contact openings are then concurrently filled with a conductive material to thereby create both wiring lines, or conductive traces or "runners," and contact openings at the same time. See, for example, Kaanta et al., "Dual Damascene: A ULSI Wiring Technology," VMIC, IEEE, Jun. 11-12, 1991, pages 144-152; Licata et al., "Dual Damascene Al Wiring for 256M DRAM," in Proceedings of VLSI Multilevel Interconnection Conference, Jun. 27-29, 1995, pages 596-602; and U.S. Pat. Nos. 5,595,937; 5,598,027; 5,635,432; and 5,612,254. Since the damascene process provides wire patterning by dielectric etching, rather than metal etching, damascene processes facilitate the use of previously unusable metals for wiring lines, in particular copper, to be reconsidered. Utilizing copper may be preferred to conventionally used aluminum in many cases since copper includes a lower resistivity and potentially better reliability in terms of electromigration resistance than that of aluminum. Further, not only does the damascene process limit the number of required process steps in not having to prevent and/or remove corrosion to the wiring lines, but it is also much easier and less time consuming to pattern dielectric material than patterning a metal or conductive material.

The use of self-aligned contact etch techniques to form interconnects in semiconductor device structures is also known. An example of a method for forming a self-aligned contact is found in U.S. Pat. No. 5,728,595 (hereinafter the "'595 patent") to Fukase. In the '595 patent, gate stacks are fabricated by conventional, non-damascene techniques on top of an active surface of a semiconductor substrate, then protected by side wall spacers and a cap. The gate stacks are then laterally surrounded with an insulation layer. A self-aligned contact opening is formed between adjacent gate stacks by etching silicon oxide side walls to form a self-aligned opening between the two gate stacks and, then, filling the self-aligned opening with a conductive material, such as polycrystalline silicon. The self-aligned contact is advantageous because it minimizes a mask alignment margin when aligning the mask preparatory to forming a contact since the contact side wall is an already fixed semiconductor element structure. In the '595 patent, the wiring lines are provided using the conventional subtractive metal etch techniques of applying a layer of conductive material and, then, removing selected portions of the conductive material to form the wiring lines. As a result, the device in the '595 patent includes the disadvantages of conventional, non-damascene wiring line fabrication processes, as previously set forth.

Thus, it would be advantageous to develop a technique and device that utilizes the advantages of both damascene conductive lines and a self-aligned contact, in which the steps to manufacture the product are reduced and the conductive lines and self-aligned contacts maintain their integrity.

BRIEF SUMMARY

The present invention relates to a method and apparatus for providing increased reliability and integrity in an interconnect structure in a semiconductor device while also increasing efficiency in the manufacturing process. The present invention is directed to providing a self-aligned contact adjacent to and electrically insulated from one or more damascene conductive lines.

In an exemplary embodiment, the present invention provides a semiconductor substrate. The semiconductor substrate may include active device regions formed therein. The semiconductor substrate may also include conductive structures formed thereover that are laterally surrounded by a first insulation layer. In any event, one or more active device regions or conductive structures are exposed at a surface of a semiconductor device structure.

In the method of the present invention, an insulation layer is formed over the surface of the semiconductor device structure. The insulation layer is then patterned to form openings therein. The openings may be trenches configured to carry wiring lines, transistor gate structures, conductive contact plugs, or other conductive structures.

The side walls of the openings are lined with a material that, when exposed to an etchant, may be etched at a slower rate than the material of the laterally adjacent insulation layer is etched. The lining is also referred to herein as a side wall spacer. The side wall spacers may be formed by disposing a suitable insulative material over at least the side walls of the openings, then removing any material from the surface of the semiconductor device structure (e.g., by known etching or abrasive techniques such as chemical-mechanical polishing (CMP) processes). By way of example only, the side wall spacers may be formed from silicon nitride if either doped or undoped silicon dioxide is used to form the insulation layer, undoped silicon dioxide if doped silicon dioxide is used to form the insulation layer, $Al_2O_3$, $Ta_2O_5$, and other electrically insulative materials that are not etched as a contact is formed through adjacent insulative material.

The lined openings are filled with conductive material to form conductive lines or other conductive structures by way of known damascene techniques. Accordingly, once the conductive structures have been formed, conductive material is removed from the surface of the semiconductor device structure.

The surfaces of the conductive lines or other conductive surfaces are then recessed relative to the surface of the semiconductor device structure by known processes, such as by etching the material of the conductive lines or other conductive structures.

An insulative cap layer is disposed over the semiconductor device structure, including over the recessed surfaces of the conductive lines or other conductive structures formed therein, by disposing a dielectric material over the semiconductor device structure. The insulative cap layer may be formed by known processes (e.g., by patterning using suitable mask and etch processes, such as a photomask and etch-back, or planarization techniques) to remove dielectric material of the insulative cap layer from areas over which the insulation layer remains, leaving dielectric material of the insulative cap layer only over the conductive lines or other conductive structures to form caps thereover. Suitable materials for the insulative cap include, without limitation, silicon nitride, undoped silicon dioxide, $Al_2O_3$, $Ta_2O_5$, and other electrically insulative materials that are not etched as a contact is formed through adjacent insulative material. Preferably, when one or more suitable etchants are employed, the dielectric material of these caps is etched at a slower rate than the material of the insulation layer. Accordingly, the insulation layer may be etched with selectivity over the caps, or the material of the insulation layer may be removed with selectivity over the removal of the dielectric material of the caps. The caps and spacers together form a protective layer around the adjacent conductive lines or other conductive structures.

As the insulation layer may be etched with selectivity over the side wall spacers and the caps of the semiconductor device structure, a self-aligned contact opening may be formed adjacent and electrically isolated from one or more of the conductive lines or other conductive structures. For example, an active surface of the semiconductor device structure may be non-selectively exposed to an etchant by known processes, such as by wet etch or dry etch processes. Upon exposing the active surface of the semiconductor device structure to an etchant, material of the insulation layer adjacent one or more of the conductive lines or other conductive structures is removed, while the one or more conductive lines or other conductive structures remain insulated by the side wall spacers and the caps. Alternatively, prior to removing material of the insulation layer, another insulation layer may be formed over the active surface of the semiconductor device structure and patterned so as to expose a region of the underlying insulation layer adjacent at least one conductive line or other conductive structure. The material of the other insulation layer may act as a hard mask for etching the material of the underlying insulation layer. The material of the insulation layer may be removed by use of suitable dry etch processes or by use of suitable wet etch processes. With the self-aligned opening formed, conductive material may then be provided to fill the opening to thereby form other conductive structures, such as a conductive contact plug, adjacent one or more damascene conductive lines or other damascene conductive structures.

The present invention may be provided in various embodiments, or variations thereof In one particular embodiment, the damascene conductive structures are digit lines. In another embodiment, the damascene conductive structures are transistor gates.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, in which:

DETAILED DESCRIPTION

Preferred embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements and features common between the figures retain the same numerical designation.

Figure 1A:
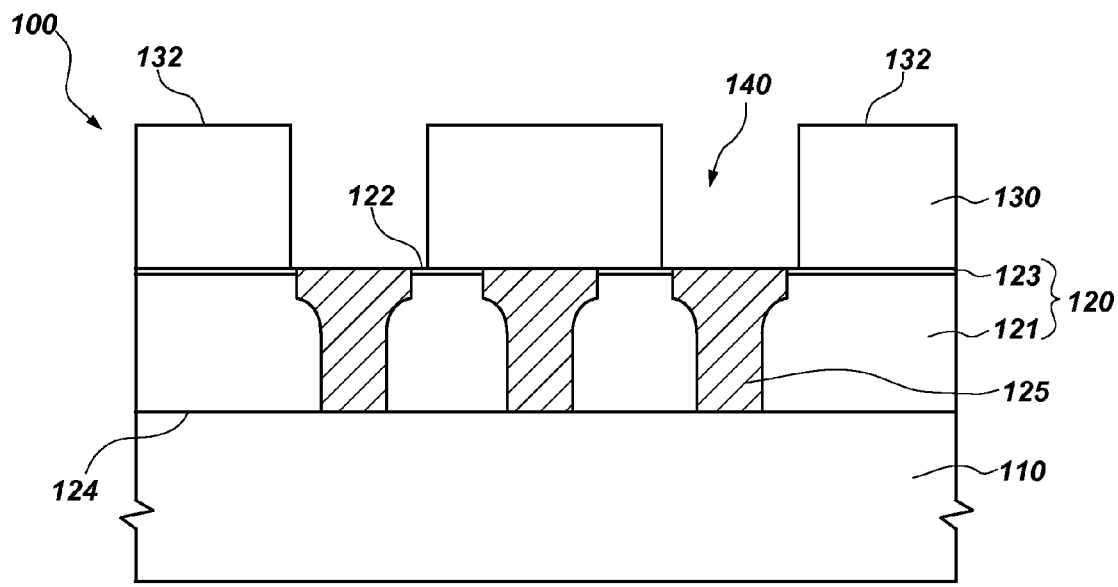
FIGS. 1(a)-1(i) are simplified partial cross-sectional views illustrating a method for fabricating a first embodiment of a self-aligned contact between two conductive damascene digit lines according to the present invention.

An exemplary embodiment of a method and apparatus incorporating teachings of the present invention is shown in FIGS. 1(a)-1(i). FIG. 1(a) depicts a simplified partial cross-sectional view of a semiconductor device structure 100 including a semiconductor substrate 110 preparatory to forming a self-aligned contact between two conductive damascene lines. In particular, FIG. 1(a) depicts a simplified cross-sectional view of a substrate 110, preferably, a semiconductor substrate, such as a full or partial wafer of silicon, gallium arsenide, indium phosphide, or another semiconductive material, or another known type of large-scale semiconductor substrate, such as silicon-on-glass (SOG) (which may be doped or undoped), silicon-on-sapphire (SOS), silicon-on-ceramic (SOC), or other silicon-on-insulator (SOI) type substrate. A first insulation layer 120 with one or more conductive structures 125, such as conductive plugs, extending therethrough may be located over the substrate 110. Conductive structures 125 may be configured to extend to both an upper surface 122 and a lower surface 124 of the first insulation layer 120.

The first insulation layer 120 may comprise any suitable dielectric material and may include one layer or multiple sublayers. By way of example, the dielectric material of the first insulation layer 120 may include a film 121 of doped silicon oxide, such as spin-on glass (SOG), borophosphosilicate glass (BPSG), borosilicate glass (BSG), or phosphosilicate glass (PSG), or an undoped silicon dioxide. The silicon oxide film 121 may be provided as a base film with a thin film 123 including silicon nitride or another nitride-containing material thereover. The materials of the first insulation layer 120 may be formed by known methods, such as by chemical vapor deposition (CVD), spin-on processes, or any other method known in the art. The conductive structures 125 may also be formed by known processes, either before or after (e.g., by patterning films 121 and 123 and introducing conductive material into recesses formed therein) the first insulation layer 120 is formed. The first insulation layer 120 and, optionally, any conductive structures 125 therein, may be planarized, as known in the art (e.g., by known chemical mechanical polishing (CMP) techniques, use of SOG processes, or by dry etch-back techniques).

With continued reference to FIG. 1(a), in practicing an exemplary method incorporating teachings of the present invention, another insulation layer 130 is formed over the substrate 110 and in contact with surface 122 of insulation layer 120 of the semiconductor device structure 100. The insulation layer 130 may be formed from any dielectric material, such as BPSG, BSG, PSG, another doped silicon dioxide, an undoped silicon dioxide, or SOG. The insulation layer 130 may comprise one layer or multiple layers and may be deposited by known methods, such as those described previously herein with respect to insulation layer 120. An upper, or active, surface 132 of the second insulation layer 130 may be planarized (e.g., by CMP techniques) to impart the insulation layer 130 with a thickness which is about the same as the desired height of conductive structures to be subsequently formed therein and extend therethrough (e.g., in the range of about 1000 angstroms to about 10,000 angstroms).

Once insulation layer 130 has been formed, it may be patterned by known techniques (e.g., by employing a photoresist mask with openings formed therein (not shown) and etching the second insulation layer 130 through the mask). By way of example and not to limit the scope of the present invention, openings 140 may be formed in the upper surface 132 of the second insulation layer 130 by anisotropic, or dry, etch processes, such as by plasma etching. Dependent upon the desired configuration of the patterned openings 140, the openings 140 may comprise, for example, trenches for conductive lines or vias. As illustrated, the openings 140 are formed in a manner that exposes the conductive structures 125. Once the openings 140 are formed, the photoresist mask may be removed to provide the structure depicted in FIG. 1(a).

Figure 1B:
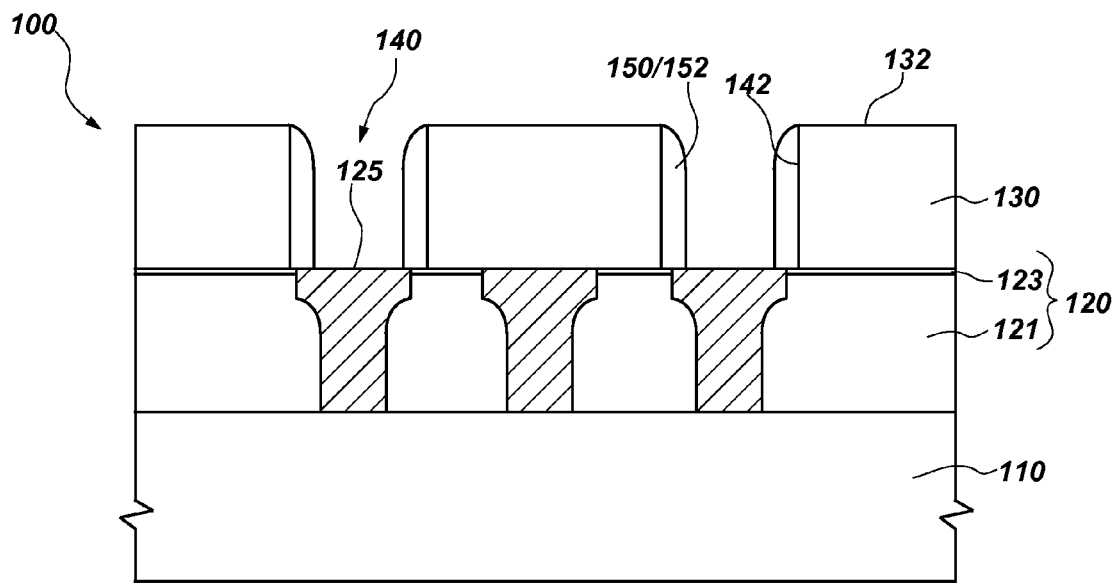

Next, as shown in FIG. 1(b), a first portion of a protective lining 150 is formed by fabricating spacers 152 on at least side walls 142 of the openings 140. The spacers 152 may be formed with any known, suitable insulative material (e.g., silicon nitride, undoped silicon dioxide, $Al_2O_3$, $Ta_2O_5$, etc.). The spacers 152 are preferably formed from a material that resists etching by certain etchants that may be used to remove material of the laterally adjacent insulation layer 130. For example, when a doped silicon dioxide is used to form insulation layer 130, silicon nitride or undoped silicon dioxide may be used to form spacers 152. Any suitable method for depositing the selected spacer 152 material may be used, including, without limitation, CVD processes. The spacer 152 material may be substantially conformably deposited over the upper surface 132 of the insulation layer 130, including on the surfaces of side walls 142, then removed from surface 132 by known processes (e.g., masking and etching or CMP) to leave insulative material on the side walls 142 and to thereby form the spacers 152.

Figure 1C:
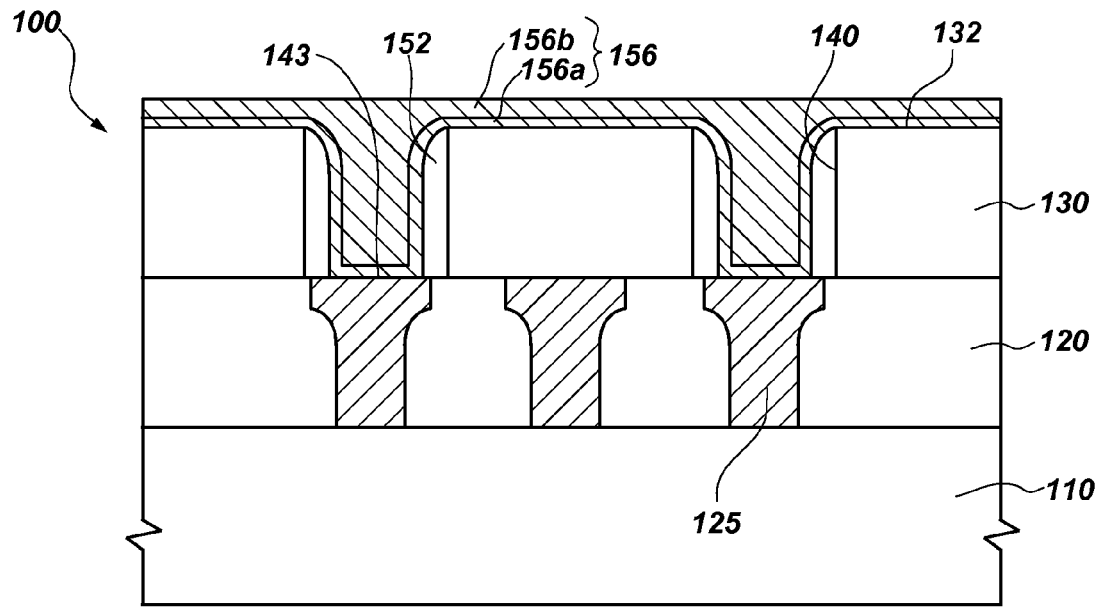
Figure 1D:
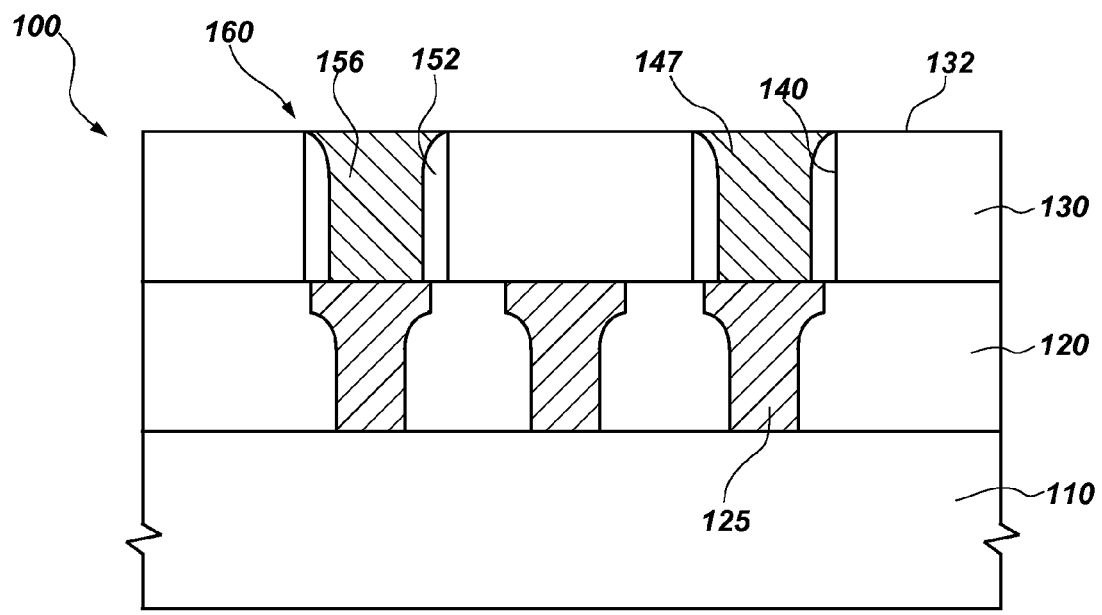

As shown in FIG. 1(c), a layer 156 of conductive material is deposited over the insulation layer 130, filling the openings 140. Layer 156 may be formed by any suitable method for the particular type of conductive material employed, including, but not limited to, sputtering, CVD, physical vapor deposition (PVD), plating, electroplating, or other techniques known in the art. Any suitable conductive material may be used to form layer 156, including, without limitation, copper, aluminum, titanium, titanium nitride, tungsten, tungsten nitride, tantalum, tantalum nitride, platinum, ruthenium, rhodium, iridium, osmium, another metal, any combination or alloy of the foregoing metals and metal alloys, a metal silicide or polycide, such as tungsten silicide, molybdenum silicide, tantalum silicide, or titanium silicide, or conductively doped polycrystalline silicon, or "polysilicon." Layer 156 may comprise one or more sublayers 156a, 156b. Layer 156 preferably has a thickness sufficient to substantially fill the openings 140. For example, sublayers 156a and 156b of titanium and a titanium alloy are used to fill openings 140 having depths of about 500 angstroms to about 8,000 angstroms. The sublayer 156a of titanium may be deposited to a thickness in the range of about 50 angstroms to about 300 angstroms, with 150 angstroms currently being preferred. Depositing a titanium layer 156a of, for example, about 150 angstroms will result in a layer overlying the spacers 152 and the bottom surface 143 of the openings 140. Another sublayer 156b of titanium nitride may then be deposited to a suitable thickness to substantially fill the openings 140. As shown in FIG. 1(c), the conductive material of layer 156 may overlie the upper surface 132 of the insulation layer 130. Accordingly, conductive material remaining on the upper surface 132 may be removed therefrom by known processes, such as planarization (e.g., by CMP) or known etching techniques, thereby forming conductive structures 160, such as damascene lines, in the openings 140, as shown in FIG. 1(d).

Figure 1E:
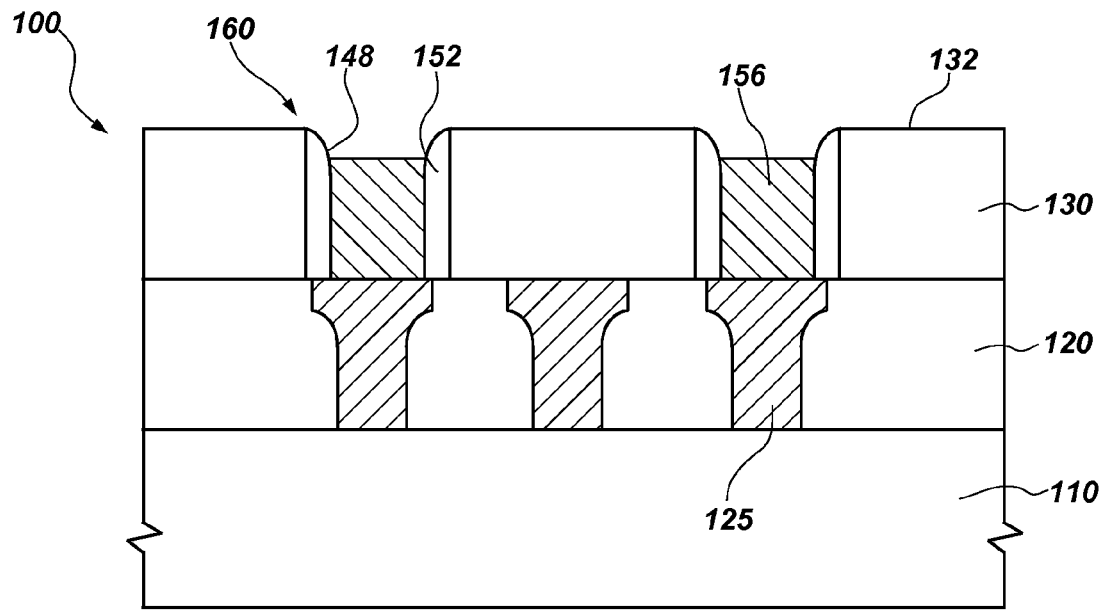

An upper portion 147 of the conductive structures 160 in the openings 140 may be removed, as shown in FIG. 1(e), so as to facilitate the alignment of a subsequently fabricated insulative cap 154 (FIG. 1(f)) over each of the conductive structures 160. By way of example, an etch-back technique may be employed, such as an anisotropic, or dry, etch or a wet etch that etches the material of layer 156 with selectivity over the materials of the spacers 152 and the insulation layer 130, as known in the art. This etch-back may be accomplished substantially concurrently with the removal of conductive material from the upper surface 132 of the insulation layer 130, or as a separate (i.e., either prior or subsequent) process. The etch-back of the upper portion 147 of the conductive structures 160 recesses the conductive structures 160 relative to the upper surface 132 of the insulation layer 130, providing a recessed area 148 above each of the conductive structures 160.

Figure 1F:
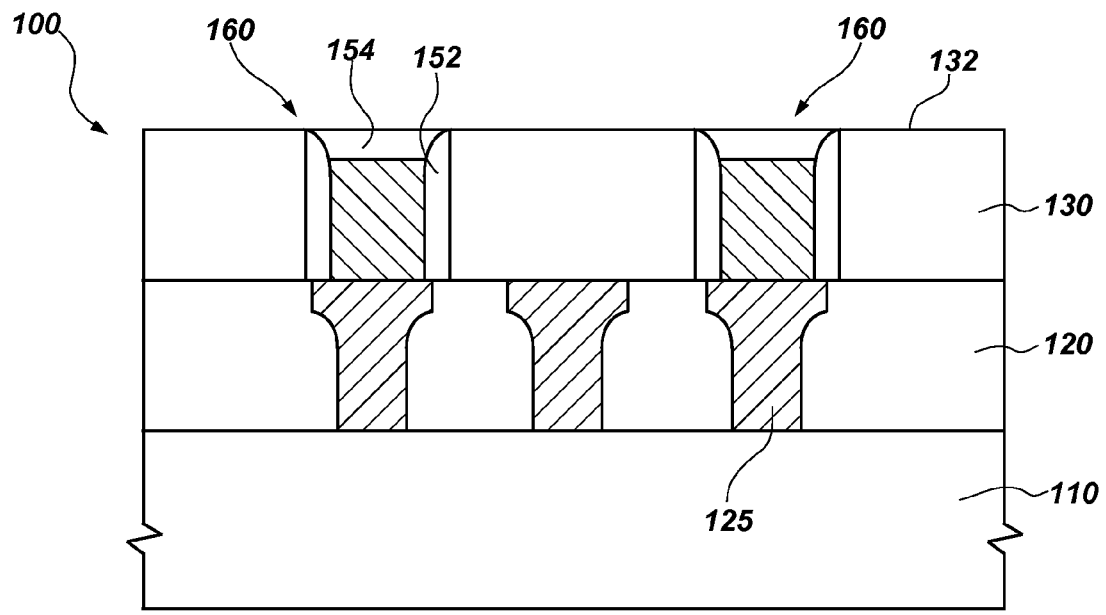

With reference to FIG. 1(f), an insulative cap 154 may be formed within each recessed area 148 so as to substantially insulate the corresponding conductive structure 160. Insulative cap 154 may be formed by any suitable, known technique, including, without limitation, by forming a layer of insulative material over the insulation layer 130 so as to substantially fill the recessed areas 148 and cover the upper surface 132 of the insulation layer 130. Any of the insulative material that overlies the upper surface 132 of the insulation layer 130 may be removed therefrom by known techniques, such as by known polishing or planarization processes or by known etching techniques. Accordingly, the insulative material of the layer remains only over the conductive structures 160, forming the insulative caps 154 thereover. The insulative caps 154 may be formed from an insulative material that is not substantially etched when the insulative material of the insulation layer 130 is removed by selective etching processes. For example, if a doped silicon dioxide (e.g., BPSG, BSG, PSG, etc.) or SOG is used to form the insulation layer 130, silicon nitride, undoped silicon dioxide, $Al_2O_3$, $Ta_2O_5$, or other suitable materials may be used to form the insulative caps 154 over the conductive structures 160. The insulative material of the insulative caps 154 may be the same material as that used to form the spacers 152 that are disposed laterally adjacent the conductive structures 160. The exposed surfaces of the insulative caps 154 may be located in substantially the same plane as that in which the upper surface 132 of the insulation layer 130 is located. With this arrangement, the conductive structures 160 and their corresponding spacers 152 and insulative caps 154 form an insulated conductive structure that is associated with a corresponding, underlying conductive structure 125, as desired.

Figure 1G:
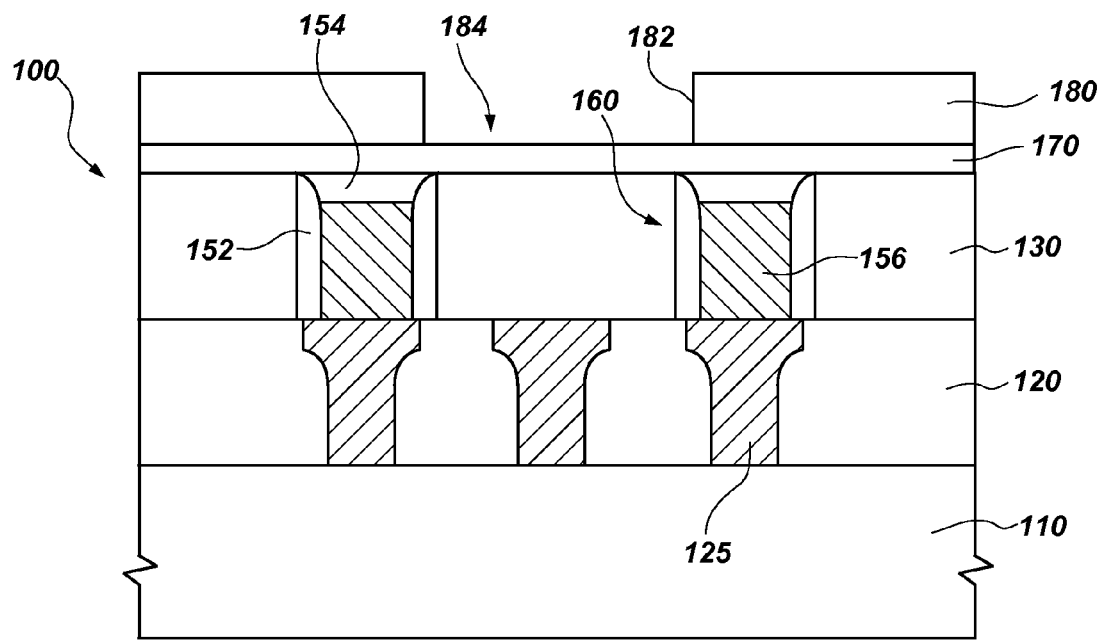

As shown in FIG. 1(g), another insulation layer 170 may be formed over insulation layer 130. Insulation layer 170 may be formed by any suitable, known method (e.g., by CVD). An electrically insulative material (e.g., doped silicon dioxide, undoped silicon dioxide, or SOG) that may be etched with the material from which the insulation layer 130 is formed without the material or materials of other structures, such as spacers 152 or insulative caps 154, may be used to form the insulation layer 170.

A photoresist 180 may be provided over insulation layer 170 and the insulation layer patterned therethrough, as known in the art, to form apertures 182 through the insulation layer 170. The apertures 182 are preferably aligned over the region 184 of insulation layer 130 located between the conductive structures 160, over at least one of the conductive structures 125 underlying the insulation layer 130, and at least partially over the side walls that are laterally adjacent to region 184, but the apertures 182 preferably do not extend over the conductive structures 160.

Figure 1H:
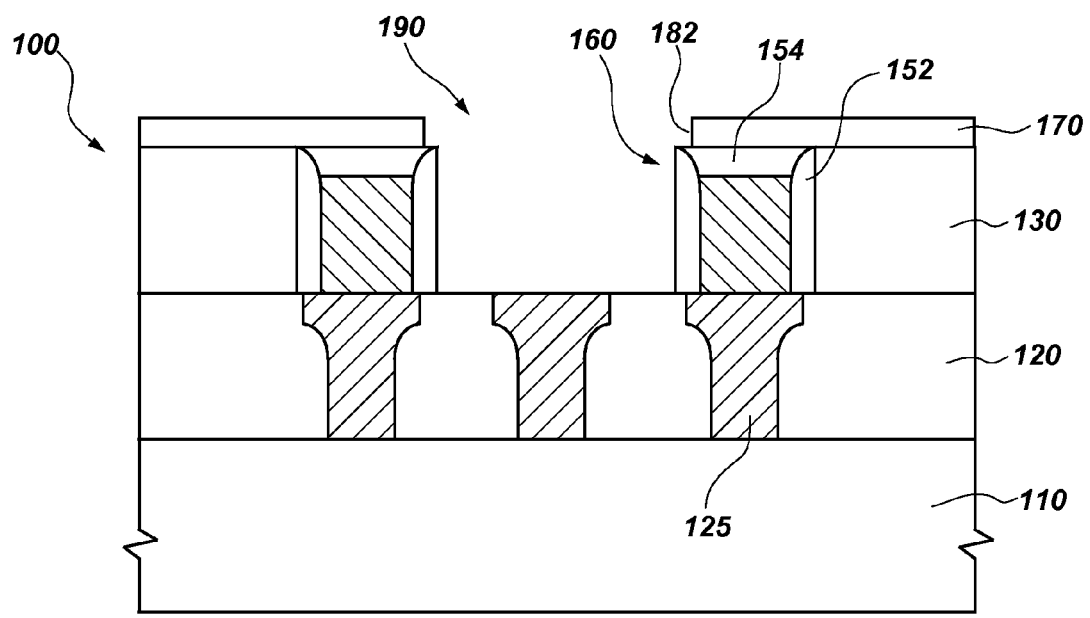

As shown in FIG. 1(h), the insulative material 130 and 170 within region 184 is removed to provide a self-aligned opening 190 in insulation layer 130. The self-aligned opening 190 at least partially exposes at least one conductive structure 125. Further, the spacers 152 are partially exposed in self-aligned opening 190 and will also subsequently serve as the side walls of a conductive structure 195 (see FIG. 1(i)) to be formed in the self-aligned opening 190.

The self-aligned opening 190 may be formed by known wet etch or dry etch techniques. If etchants are used to form self-aligned opening 190, the etchants are preferably selected for their ability to remove the insulative material of the insulation layers 130 and 170 with selectivity over, or at a faster rate than, the material of spacers 152 and insulative caps 154 is removed. For example, hydrofluoric acid (HF) is useful for removing doped silicon dioxide with selectivity over both silicon nitride and undoped silicon oxides. As another example, the dry etchants disclosed in U.S. Pat. No. 6,117,791 to Ko et al., and assigned to the same assignee as the present invention, the disclosure of which is hereby incorporated herein by this reference in its entirety, are also useful for removing doped silicon dioxides with selectivity over both silicon nitride and undoped silicon oxides. Since the spacers 152 and the insulative caps 154 are not substantially removed by such selective etching processes, only region 184 of insulation layers 130 and 170, adjacent the conductive structures 160, is removed by the selective etch. The result is a self-aligned opening 190 electrically isolated from the adjacent conductive structures 160. The self-aligned opening 190 may be a trench configured to hold a conductive line, a via configured to receive a conductive plug, or any other type of recess configured to at least partially contain a conductive structure. Of course, the configuration of self-aligned opening 190 may be determined by the configuration of the apertures 182 that were previously formed in the photoresist 180. As such, the configuration of self-aligned opening 190 may be easily defined, adjusted or changed by simply adjusting the configuration of the corresponding aperture 182 (see FIG. 1(g)).

Figure 1I:
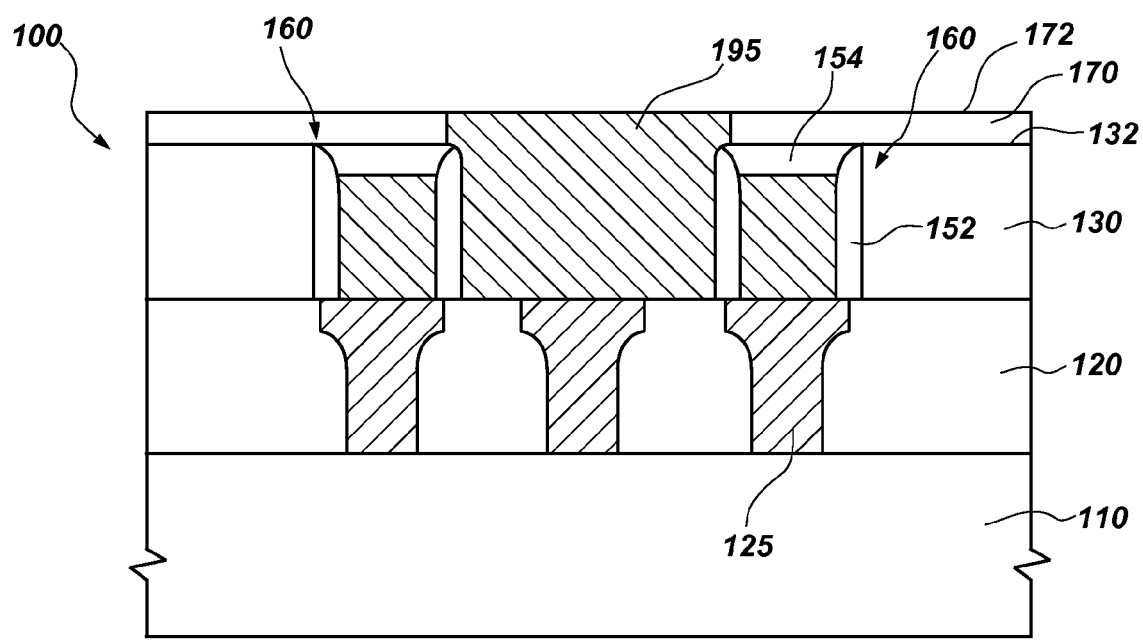

As shown in FIG. 1(i), a conductive structure 195 may be formed in the self-aligned opening 190 by providing a conductive material, such as those described above in reference to FIG. 1(c), therein. The conductive material may be deposited at least into self-aligned opening 190 by CVD, PVD, plating, electroplating, or any other suitable conductive layer or conductive structure fabrication process known in the art. Any excess conductive material remaining over an upper surface 172 of insulation layer 170 or over the upper surface 132 of insulation layer 130 may be removed therefrom by known processes (e.g., by planarization, polishing or etching the material therefrom). Preferably, the upper surface of conductive structure 195 resides in substantially the same plane as the upper surface 172 of insulation layer 170 or as the upper surface 132 of insulation layer 130. The conductive material may include, but is not limited to, aluminum, copper, titanium, titanium nitride, another suitable metal, any combination or alloy of metals, or polycrystalline silicon.

Figure 2A:
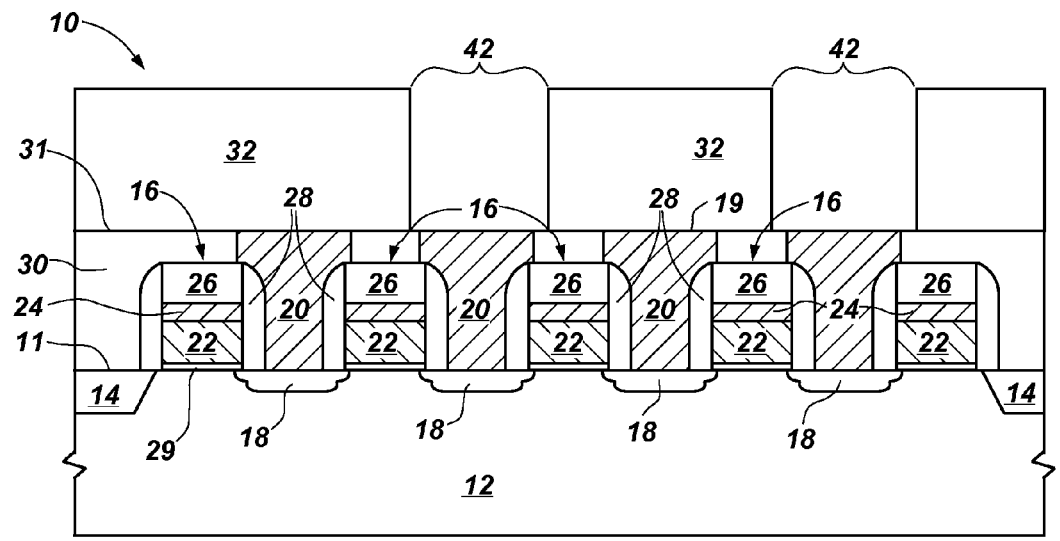
FIGS. 2(a)-2(f) depict a variation of the process shown in FIGS. 1(a)-1(i)

Turning now to FIGS. 2(a)-2(f), another embodiment of a process that incorporates teachings of the present invention is depicted. The process depicted in FIGS. 2(a)-2(f) is substantially the same as that described herein in reference to FIGS. 1(a)-1(i), except that the semiconductor device structure 10 includes an existing layer of transistor gates 16, which may be fabricated by any of a series of suitable, known semiconductor device fabrication techniques. As depicted in FIG. 2(a), the semiconductor device structure 10 includes a substrate 12 (e.g., a full or partial semiconductor wafer or a silicon-on-insulator type substrate, as described above in reference to FIG. 1(a)) with a plurality of field isolation structures 14 formed at an active surface 11 thereof The depicted semiconductor device structure 10 includes shallow trench isolation (STI) structures as the isolation structures 14 thereof, which are recessed in the substrate 12. Additionally, semiconductor device structure 10 includes active-device regions 18, which comprise conductively doped regions of the substrate 12 that are laterally discrete from one another and continuous with the active surface 11. Transistor gates 16 are formed on the active surface 11 of the substrate 12, as well as on regions of the isolation structures 14 that are located adjacent to the active surface 11, between adjacent active-device regions 18. Each transistor gate 16 includes a gate oxide layer 29, which rests upon active surface 11 and separates overlying conductive lines 22 and 24 from the active surface 11. The conductive lines 22 and 24 of each transistor gate 16 are electrically insulated from adjacent structures by way of side wall spacers 28 on each side thereof and an insulative cap 26 positioned over the uppermost conductive line 24. The semiconductor device structure 10 shown in FIG. 2(a) also includes an insulation layer 30, which covers portions of transistor gates 16. At least some of the active-device regions 18 of the substrate 12 are electrically exposed through the insulation layer 30 by way of conductive plugs 20 that extend through the insulation layer 30. As shown, the upper surface 19 of each conductive plug 20 has been planarized and resides in substantially the same plane as the upper surface 31 of the insulation layer 30.

Another layer of insulative material, referred to herein as insulation layer 32, is formed over insulation layer 30. Known processes, such as CVD processes, may be used to form the insulation layer 32. Doped silicon dioxides, or glasses, such as borophosphosilicate glass (BPSG), borosilicate glass (BSG), phosphosilicate glass (PSG), and spin-on glass (SOG), are examples of materials from which the insulation layer 32 may be formed. Following the formation and optional planarization (e.g., by CMP) thereof, the insulation layer 32 may be patterned (e.g., by mask and etch techniques) to form one or more openings 42 therein. Each opening 42 may, as shown, expose a corresponding conductive plug 20.

Figure 2B:
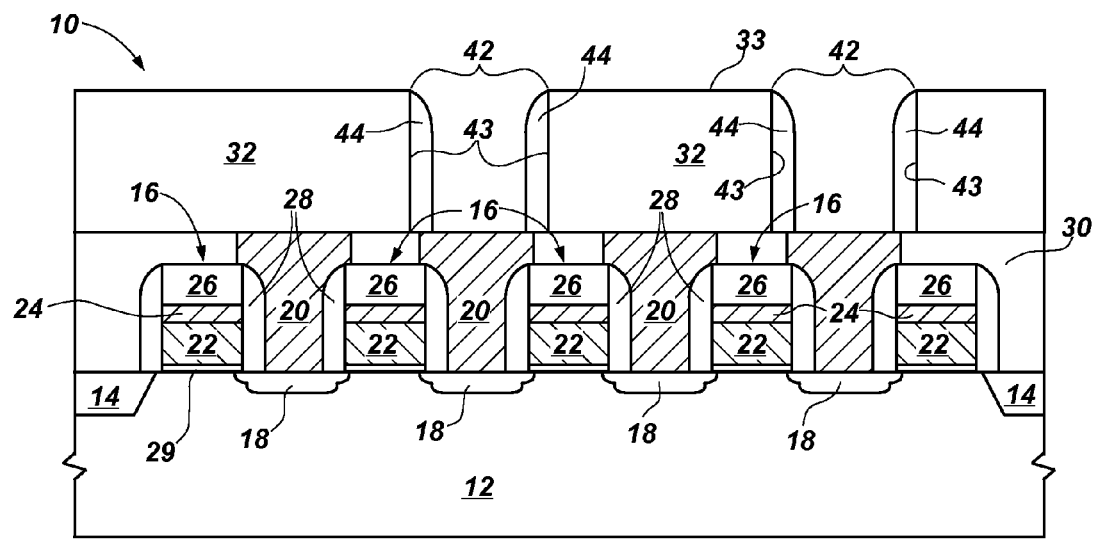

As shown in FIG. 2(b), the side walls 43 of each opening 42 may be lined with an insulative material (e.g., silicon nitride, undoped silicon dioxide, $Al_2O_3$, $Ta_2O_5$, etc.) that may resist removal by at least some etchants that will remove the material of the adjacent insulation layer 32 and, optionally, the material of insulation layer 30. Such lining may be effected by known deposition processes (e.g., CVD) or otherwise, as known in the art. If deposition processes are employed, it may be necessary to remove insulative material from the upper surface 33 of the insulation layer 32. The resulting structures are spacers 44 that are located adjacent to the side walls 43 of each opening 42.

Figure 2C:
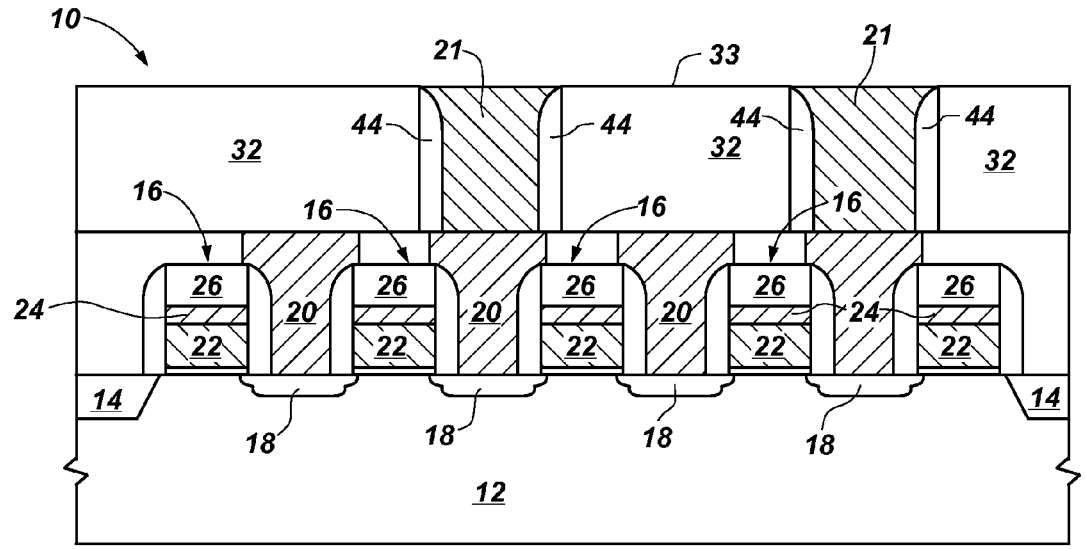

Next, as FIG. 2(c) shows, a quantity of a suitable electrically conductive material, such as those described above in reference to FIG. 1(c), may be introduced into each opening 42 to form a wiring line 21 therein. Of course, the techniques that may be employed to introduce the electrically conductive material into openings 42 depend upon the type or types of conductive material with which the openings 42 are being filled. By way of example only, deposition processes (e.g., CVD), such as the titanium/titanium alloy deposition techniques described above in reference to FIG. 1(c), or titanium/titanium nitride, titanium/titanium nitride/aluminum-copper alloy, or barrier layer/copper, may be used to introduce the electrically conductive material into the openings 42. Again, it may be necessary to remove (e.g., by CMP or etching) the electrically conductive material from the upper surface 33 of the insulation layer 32.

Figure 2D:
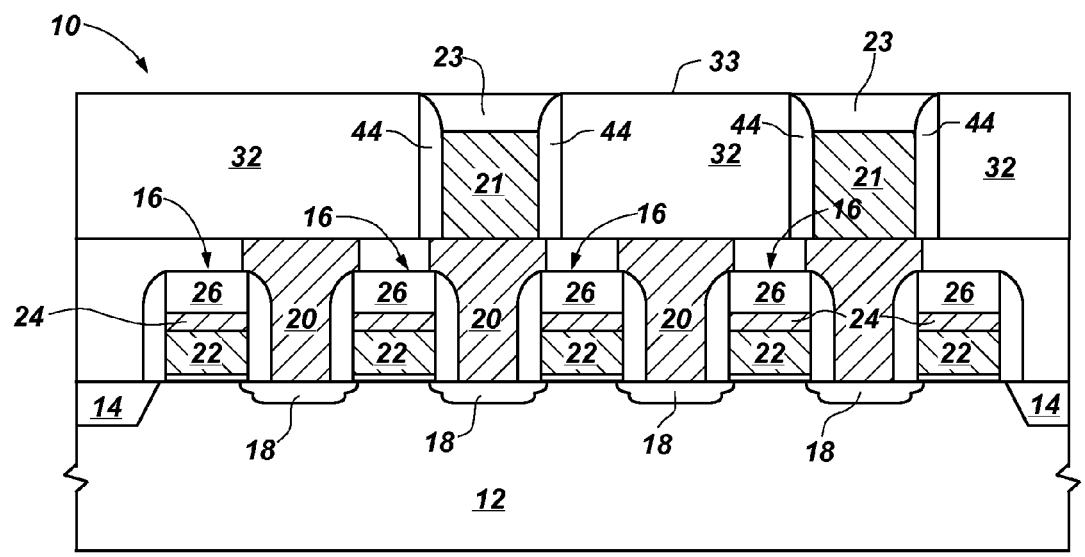

FIG. 2(d) illustrates the removal of an upper portion of each wiring line 21 to recess the same beneath the plane in which the upper surface 33 of the insulation layer 32 is located. Such removal may, by way of example, be effected by etching the electrically conductive material from which wiring lines 21 are formed with selectivity over the materials from which the insulation layer 32 and the spacers 44 are formed. If etching processes are also used to remove the electrically conductive material from the upper surface 33, these acts may be effected during the same etch process. An insulative material may then be introduced (e.g., by CVD) over the wiring lines 21 and into the upper portion of each opening 42 and any excess insulative material removed from the upper surface 33 of the insulation layer 32 to form an insulative cap 23 over each wiring line 21. The material from which insulative caps 23 are formed may or may not be the same as the material from which spacers 44 are formed.

Figure 2E:
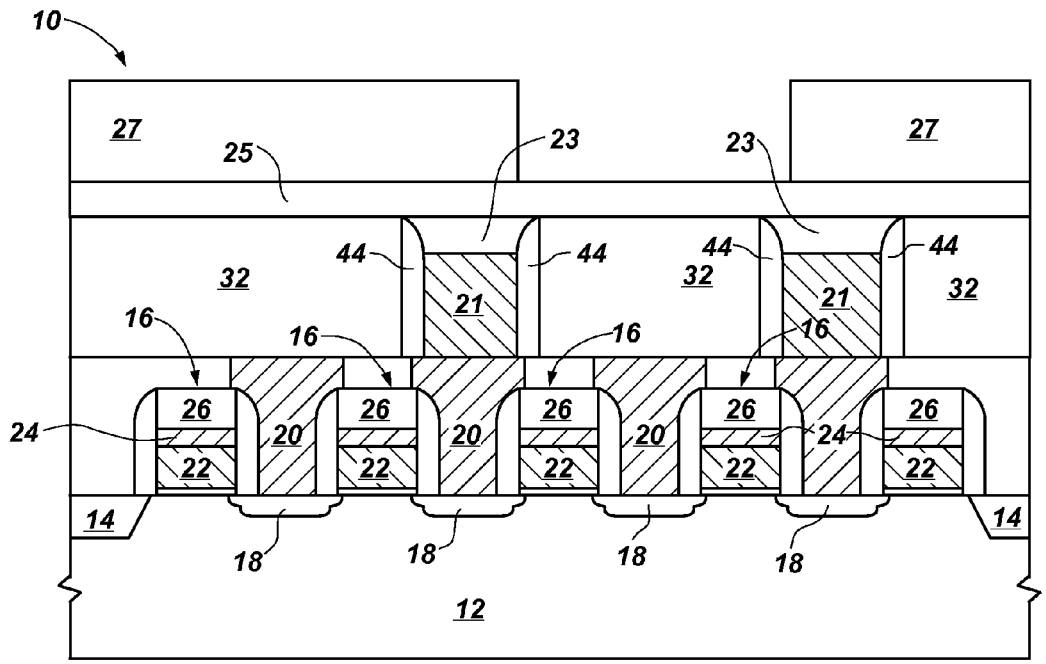

Turning now to FIG. 2(e), another insulation layer 25 may be formed (e.g., by CVD) over insulation layer 32 and the wiring lines 21 that extend therethrough. As with insulation layers 30 and 32, insulation layer 25 may be formed from a material (e.g., undoped silicon dioxide, doped silicon dioxide, etc.) that may be etched with selectivity over the material or materials from which the insulative caps 23 and spacers 44 are formed. Following the formation of the insulation layer 25, a mask 27 (e.g., a photomask) may be formed thereover (e.g., by exposing and developing selected regions of a layer of photoresist, then baking the remaining portions thereof). As shown, regions of the insulation layer 25 that are located over and laterally between adjacent wiring lines 21 are exposed through mask 27.

Figure 2F:
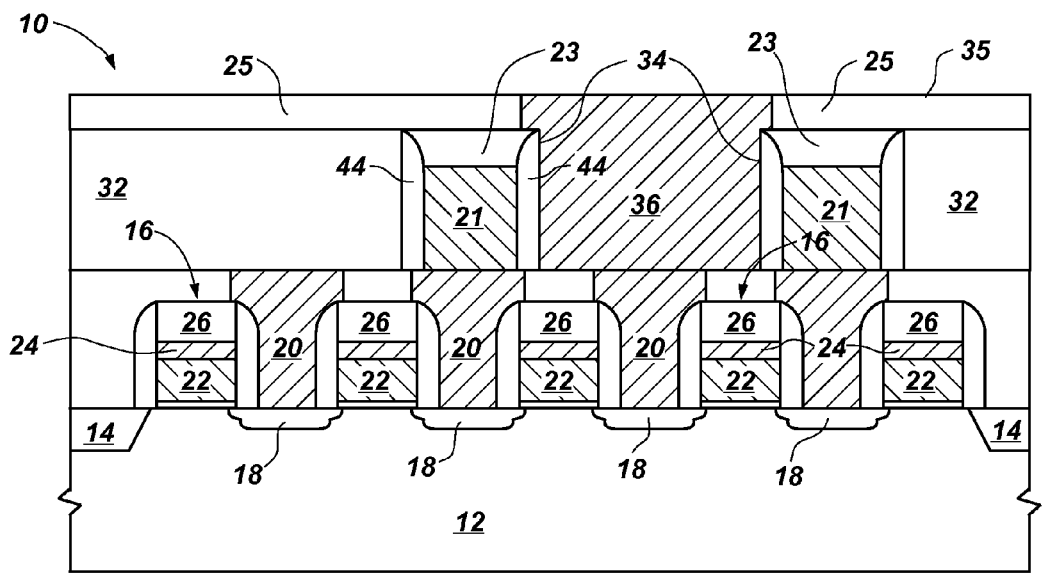

Once mask 27 has been formed, the portions of the insulation layer 25 that are exposed therethrough may be etched or otherwise removed, as known in the art and illustrated in FIG. 2(f). Thereafter, and preferably during the same etch process, the insulative material of underlying regions of the next-lower insulation layer 32 may also be removed. By way of example, and as described above in reference to FIG. 1(h), known selective etchants may be used to remove the insulative material of one or both of insulation layer 25 and insulation layer 32. When selective etchants are used, the insulative cap 23 and spacers 44 surrounding each wiring line 21 ensure that the opening, or contact 34, which is formed by removing insulative material from insulation layer 32, is self-aligned adjacent to at least one wiring line 21 and, preferably, as shown, between adjacent wiring lines 21. As depicted, the contact 34 may expose a selected wiring line 21 through insulation layers 25 and 32. Conductive material may then be introduced into each contact 34 and removed from an upper surface 35 of the insulation layer 25 to form a contact plug 36 within each contact 34.

Another exemplary embodiment of semiconductor device structure 200 incorporating teachings of the present invention is illustrated in FIGS. 3(a)-3(d), which provide partial, simplified cross-sectional views of two self-aligned contacts adjacent a conductive line that was formed using damascene processes. An exemplary method by which this alternative structure 200 may be fabricated is similar to the previously described embodiment with the exception that the conductive structures 295 (see FIG. 3(d)) are adjacent to only one other conductive structure 260, such as a single damascene line, rather than between two conductive structures 160, as in the previously described embodiment of semiconductor device structure 100 (see FIGS. 1(a)-1(i)). As such, semiconductor device structure 200 may be fabricated using substantially the same techniques and materials as those described previously herein, with the exception that a mask must be employed to form the openings 240 in which the conductive structures 295 are to be formed.

Figure 3A:
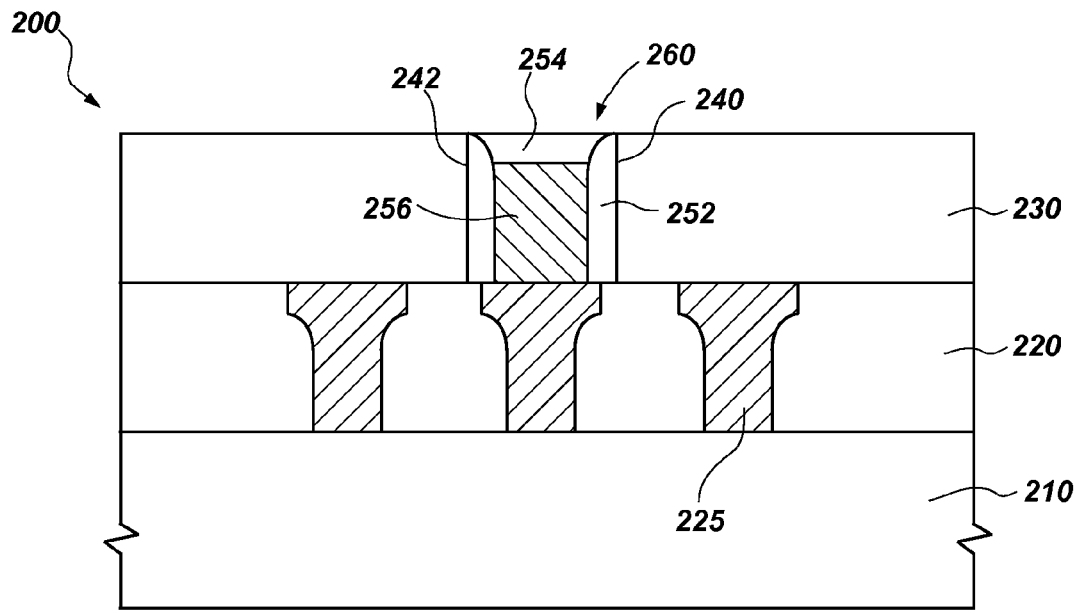
FIGS. 3(a)-3(d) are simplified partial cross-sectional views illustrating a method for fabricating an alternative to the first embodiment of a self-aligned contact adjacent a conductive damascene digit line according to the present invention.
Figure 3B:
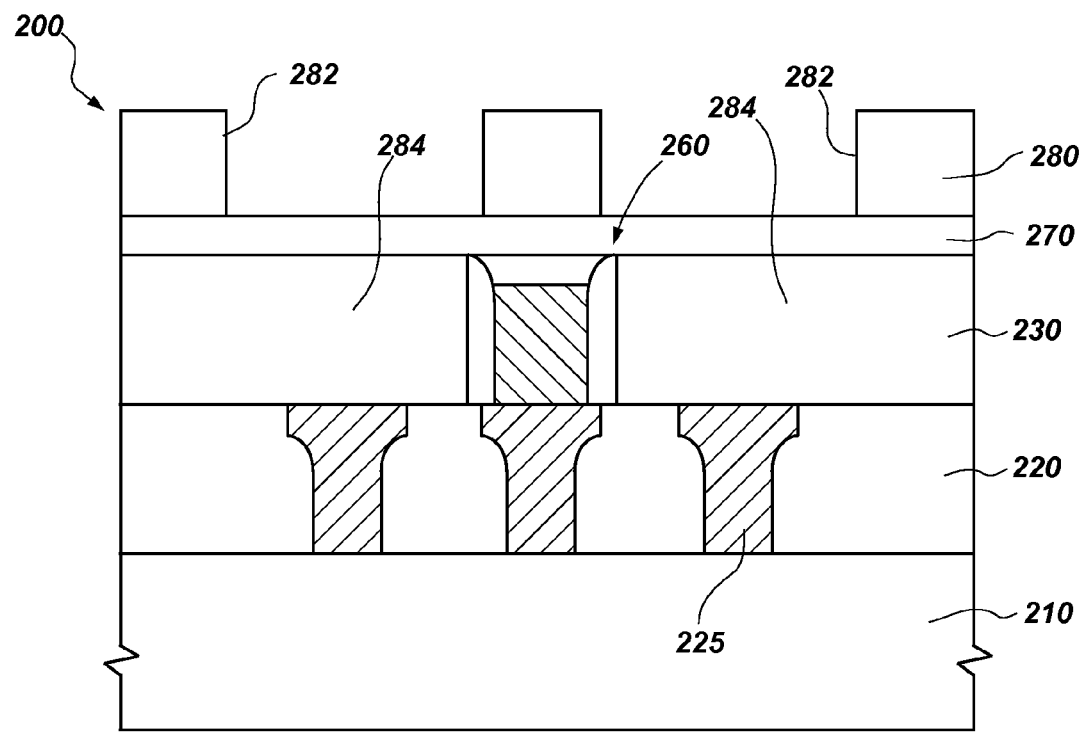
Figure 3C:
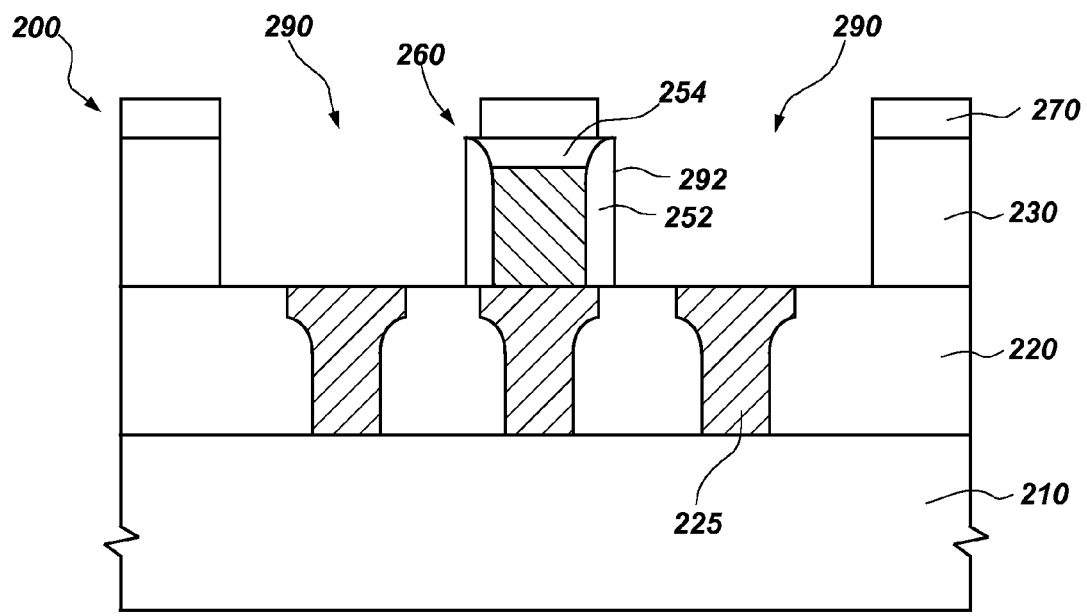
Figure 3D:
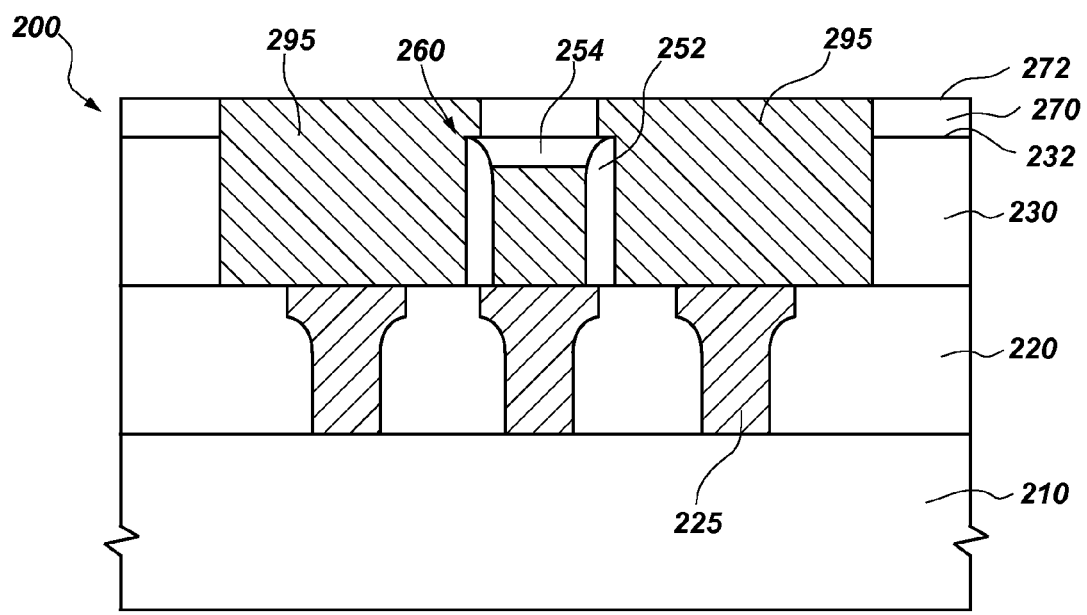

As shown, FIG. 3(a) depicts a semiconductor device structure 200 with a semiconductor substrate 210 and conductive structures 225, such as the depicted conductive plugs or conductive lines, active device regions, or other circuit components, at least partially contacted by an insulation layer 230. As depicted, conductive structures 225 are formed in an underlying insulation layer 220, but conductive structures 225, such as active device regions, may alternatively be formed in the substrate 210. Insulation layer 230 includes an opening 240 over one of the conductive structures 225. At least the side walls 242 of opening 240 are lined with a suitable insulative material to form spacers 252 and substantially filled with a suitable conductive material 256 so as to form another conductive structure 260 associated with the underlying conductive structures 225. An insulative cap 254 is formed over the conductive structure 260. The insulative material of insulation layer 230 is preferably selectively etchable with respect to the insulative material or materials of the side wall spacers 252 and insulative cap 254, as described previously herein with respect to the insulative layer 130, spacers 152, and insulative caps 154 of the semiconductor device structure 100 depicted in FIGS. 1(*a*)-1(*i*).

FIG. 3(*b*) depicts another insulation layer 270 which may be provided over insulation layer 230. A photoresist layer 280 with apertures 282 formed therethrough is positioned over insulation layer 270. The apertures 282 through the photoresist layer 280 are aligned over at least one region 284 of the insulation layer 230 that is located laterally adjacent to the conductive structure 260. As shown in FIG. 3(*c*), the insulation layers 230 and 270 may be etched through apertures 282 to form self-aligned opening 290. The self-aligned opening 290 may be formed by use of known dry etch or other anisotropic etch processes, which form a substantially vertical side wall 292 relative to the plane of insulation layer 230. The use of known isotropic etch processes to form self-aligned opening 290 are, however, also within the scope of the present invention. The photoresist layer 280 may be removed after the self-aligned opening 290 has been formed. In this embodiment, only one of the side walls 292 of each self-aligned opening 290 is formed by a spacer 252. Thus, only one side of the self-aligned opening 290 is actually self-aligning, the other side of the self-aligned opening 290 being determined by the aperture 282 of the photoresist layer 280.

As shown in FIG. 3(*d*), conductive material, such as one or more of those described above in reference to FIG. 1(*c*), may be deposited in self-aligned opening 290 by known processes, such as by the conductive material deposition processes discussed previously herein. Any excess conductive material may be removed from upper surface 232 of insulation layer 230 or from upper surface 272 of insulation layer 270 by known processes, such as by known polishing, planarization, or etching processes. As a result, one or more conductive structures 295 are formed within self-aligned opening 290 and electrically isolated from a laterally adjacent conductive structure 260.

Figure 4:
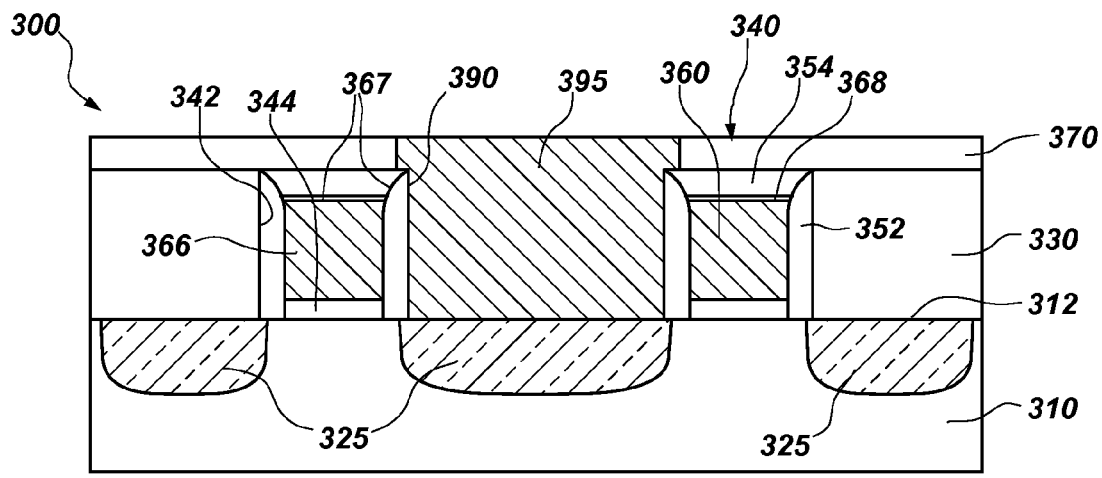
FIG. 4 is a simplified partial cross-sectional view illustrating a second embodiment of a self-aligned contact adjacent one or more transistor gates according to the present invention.

Yet another exemplary embodiment of semiconductor device structure 300 incorporating teachings of the present invention is illustrated in FIG. 4. As depicted, semiconductor device structure 300 includes a semiconductor substrate 310 with active device regions 325 formed therein and continuous with an active surface 312 thereof. Transistor gate structures 340 are formed on active surface 312 and include a gate oxide 344 in contact with active surface 312 and isolating an overlying conductive line 360 from substrate 310 and active surface 312 thereof Each transistor gate structure 340 also includes side wall spacers 352 laterally adjacent at least the conductive line 360 thereof and an insulative cap 354 disposed over the conductive line 360 thereof The transistor gate structures 340 are formed in an insulation layer 330 in accordance with methods of the present invention. Accordingly, the insulative material of insulation layer 330 may be etched with selectivity over the insulative material or materials of side wall spacers 352 and insulative caps 354. Another insulation layer 370 may also be positioned over insulation layer 330 and the transistor gate structures 340. A self-aligned opening 390 is formed between adjacent transistor gate structures 340 by employing the methods of the present invention, as described previously herein. One of the active device regions 325 formed in substrate 310 is at least partially exposed through the self-aligned opening 390. A conductive structure 395, such as a conductive contact plug, may be formed in the self-aligned opening 390. Other structures of semiconductor device structure 300 that overlie the portion of semiconductor device structure 300 depicted in FIG. 4 may subsequently be formed, as known in the art.

By way of example, and not to limit the scope of the present invention, openings in which transistor gate structures 340 are to be located, may be formed in insulation layer 330, as previously described herein, so as to be laterally offset from active device regions 325. At least side walls 342 of openings in which the transistor gate structures 340 are to be formed are lined with side wall spacers 352, as described previously herein. The gate oxide 344 of an exemplary transistor gate structure 340 may be formed by growing an oxide layer between the active device regions 325 exposed through openings in which transistor gate structures 340 are to be formed. A layer formed from polycrystalline silicon or another suitable conductive material (e.g., one or more of those described above in reference to FIG. 1(*c*)) may be deposited at least within the openings in which transistor gate structures 340 are to be formed and over the gate oxide 344 to form conductive lines within the openings. The conductive material may then be etched back to form a recess 367 over each conductive line 360. If polycrystalline silicon is used to farm conductive lines 360, the polycrystalline silicon may be implanted with an n-type or p-type dopant. A selective silicide 368 may then be formed in the recess 367 over the doped polycrystalline silicon layer 366. An insulative cap 354 may then be formed by known processes, such as those described previously herein. It should be recognized that the described method for forming a transistor gate structure is merely exemplary.

Figure 5:
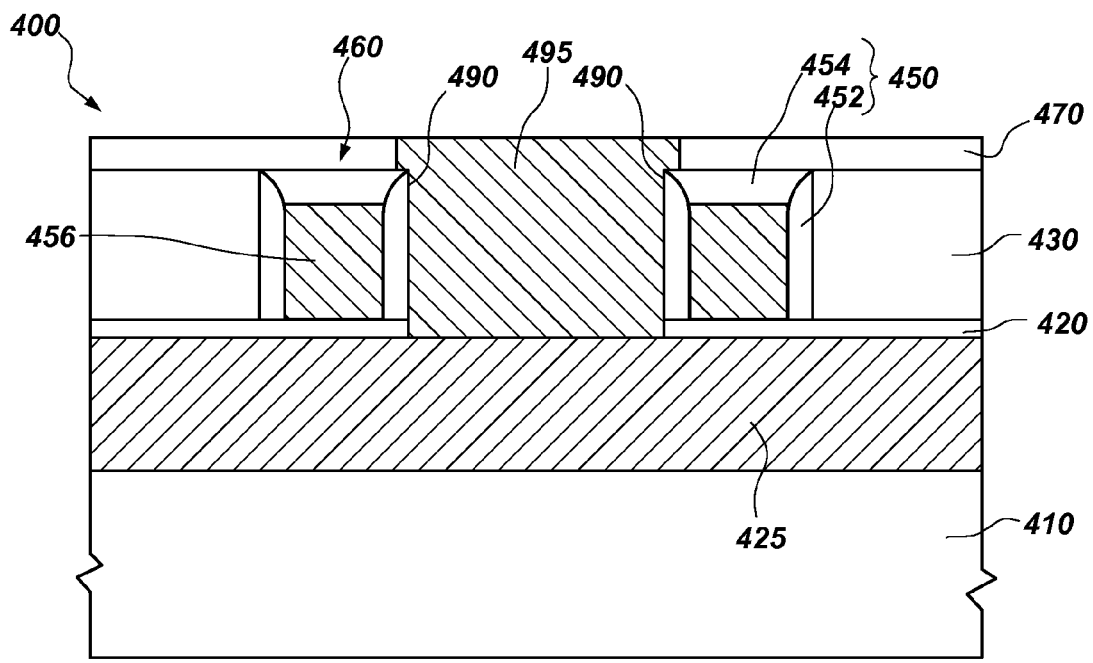
FIG. 5 is a simplified partial cross-sectional view illustrating a third embodiment of a self-aligned contact etch adjacent one or more metal lines according to the present invention.

Still another exemplary embodiment of semiconductor device structure 400 according to the present invention is illustrated in FIG. 5. Semiconductor device structure 400 includes a semiconductor substrate 410 with a conductive line 425 thereover, as well as a plurality of damascene conductive lines 460 overlying and traversing conductive line 425. The conductive elements 456 of damascene conductive lines 460 are electrically isolated from the underlying conductive line 425 by way of a first insulation layer 420 overlying conductive line 425. The upper and lateral surfaces of each conductive element 456 are surrounded by a protective layer 450, which includes side walls 452 adjacent the lateral surfaces of each conductive element 456 and an insulative cap 454 covering the upper surface of each conductive element 456. A self-aligned opening 490 is located between the side walls 452 of adjacent damascene conductive lines 460 and communicates with openings formed through an insulation layer 470 that overlies the damascene conductive lines 460. A damascene conductive plug 495, which communicates with the underlying conductive line 425, is disposed in self-aligned opening 490 between adjacent damascene conductive lines 460 and electrically isolated therefrom by way of a portion of protective layer 450. The remainder of each damascene conductive line 460 is laterally surrounded by a second insulation layer 430. As semiconductor device structure 400 may be fabricated in accordance with methods incorporating teachings of the present invention, the second insulation layer 430 is preferably fabricated from an insulative material that is selectively etchable with respect to the insulative materials of the side walls 452 and the insulative caps 454. The first insulation layer 420 may be fabricated over conductive line 425 by known processes, including, without limitation, known CVD techniques, oxidation processes, and other known methods for forming layers from electrically insulative materials. Each of the other described and illustrated features of semiconductor device structure 400 that overlies the semiconductor substrate 410 may then be fabricated in the same manner as the other embodiments of semiconductor device structures described previously herein.

As the methods of the present invention include forming a first conductive structure at least partially enclosed within a protective layer that is formed from materials that are able to resist removal by etchants that are used to remove adjacent portions of a different type of insulative material prior to forming an adjacent conductive structure, the margin for error or misalignment of the opening for the adjacent conductive structure is minimal.

Further, it is well appreciated that the protective layer formed around the damascene conductive structures prevents the damascene conductive structures from corroding or from electrically shorting with other electrically conductive components. Also, by combining the damascene lines with the self-aligned contact, the number of steps necessary for manufacture is reduced, there is increased time efficiency, and the fabricated, adjacent conductive structures better maintain their integrity.

While the present invention has been disclosed in terms of exemplary embodiments and variations thereof, those of ordinary skill in the art will recognize and appreciate that the invention is not so limited. Those of ordinary skill in the art will recognize and appreciate that many additions, deletions and modifications to the disclosed embodiment and its variations may be implemented without departing from the scope of the invention, which is limited only by the appended claims and their legal equivalents.

What is claimed is:

1. A semiconductor device structure, comprising:
    at least one pair of active device regions in a semiconductor substrate;
    an insulation material comprising a first insulative material over the at least one pair of active device regions;
    at least one first trench in the insulation material, aligned between the at least one pair of active device regions, and including vertical sidewalls, the at least one first trench:
        at least partially lined with a second insulative material;
        substantially filled with a conductive structure; and
        comprising an insulative cap overlying the conductive structure, the insulative cap comprising a third insulative material, the first insulative material selectively etchable with respect to the second and third insulative materials; and
    a discrete conductive structure adjacent to the second insulative material, a broadest region of the discrete conductive structure contacting and partially overlying an upper surface of the insulative cap.

2. The semiconductor device structure of claim 1, wherein the discrete conductive structure is disposed within a second trench adjacent to the at least one first trench and electrically isolated from the at least one first trench at least by the second insulative material.

3. The semiconductor device structure of claim 2, wherein the at least one second trench is located between a pair of adjacent first trenches.

4. The semiconductor device structure of claim 1, wherein the second insulative material, the third insulative material, and the conductive structure within the at least one first trench comprise a transistor gate structure associated with the at least one pair of active device regions in the semiconductor substrate.

5. The semiconductor device structure of claim 4, wherein the discrete conductive structure adjacent the second insulative material comprises a conductive contact plug.

6. The semiconductor device structure of claim 1, further comprising at least another trench laterally adjacent the at least one first trench.

7. The semiconductor device structure of claim 6, wherein the second insulative material is disposed between the at least another trench and the conductive structure substantially filling the at least one trench.

8. The semiconductor device structure of claim 6, wherein the at least another trench is substantially filled with a conductive material forming the discrete conductive structure.

9. A semiconductor device structure, comprising:
    at least one active device region disposed in a substrate and comprising at least one conductive structure extending through a first insulative material overlying the substrate;
    at least one opening in a second insulative material overlying the first insulative material;
    spacers overlying sidewalls of the at least one opening, the spacers comprising a third insulative material different than the second insulative material;
    a conductive material disposed within a remaining portion of the at least one opening;
    an insulative cap overlying the conductive material; and
    another conductive structure contacting at least one of the spacers and extending from the at least one conductive structure through a fourth insulative material overlying the second insulative material.

10. The semiconductor device structure of claim 9, wherein the second insulative material is selectively etchable with respect to the first and third insulative materials and the insulative cap.

11. The semiconductor device structure of claim 9, wherein the at least one opening is substantially aligned with at least a portion of the at least one conductive structure.

12. The semiconductor device structure of claim 9, wherein the at least one opening terminates at a surface of the at least one conductive structure.

13. The semiconductor device structure of claim 9, wherein the conductive material substantially fills the at least one opening in the second insulative material.

14. The semiconductor device structure of claim 9, wherein an upper surface of the conductive material is recessed below upper surfaces of each of the second insulative material and the spacers.

15. The semiconductor device structure of claim 9, wherein the at least one opening overlies and aligns with the at least one active device region.

16. The semiconductor device structure of claim 9, wherein an upper surface of the insulative cap is substantially coplanar with an upper surface of the second insulative material.

17. A method of forming an intermediate semiconductor structure, comprising:
    forming at least one opening in a first insulative material overlying at least one pair of active regions in a semiconductor substrate;
    lining sidewalls of the at least one opening with a second insulative material;
    at least partially filling a remaining portion of the at least one opening to form a conductive structure;
    forming a third insulative material over the conductive structure to form an insulative cap;
    removing a portion of the first insulative material selective to the second and third insulative materials to form another opening; and
    at least partially filling the another opening to form a discrete conductive structure adjacent to the second insulative material, a broadest region of the discrete conductive structure contacting and partially overlying an upper surface of the insulative cap.

18. The method of claim 17, wherein forming at least one opening in a first insulative material overlying at least one pair of active regions in a semiconductor substrate comprises forming the at least one opening aligned between the at least one pair of active device regions.

19. The method of claim 17, wherein forming a third insulative material over the conductive structure to form an insulative cap comprises substantially filling a recess defined by opposing sidewalls of the second insulative material with the third insulative material.

\* \* \* \* \*

UNITED STATES PATENT AND TRADEMARK OFFICE
CERTIFICATE OF CORRECTION

PATENT NO.         : 8,461,692 B2                                                 Page 1 of 1
APPLICATION NO.    : 13/237447
DATED              : June 11, 2013
INVENTOR(S)        : Howard E. Rhodes It is certified that error appears in the above-identified patent and that said Letters Patent is hereby corrected as shown below:

On the Title Page, Item (57), under "Abstract", column 2, line 12, delete "adjacent the" and insert -- adjacent to the --, therefor.

In the Claims:

In column 13, line 66, in Claim 5, delete "adjacent the" and insert -- adjacent to the --, therefor.

In column 14, line 2, in Claim 6, delete "adjacent the" and insert -- adjacent to the --, therefor.

Signed and Sealed this
Tenth Day of September, 2013

Teresa Stanek Rea
*Acting Director of the United States Patent and Trademark Office*